United States Patent [19]
Yamagata

[11] Patent Number: 6,060,892
[45] Date of Patent: May 9, 2000

[54] PROBE CARD ATTACHING MECHANISM

[75] Inventor: Kazumi Yamagata, Yamanashi-ken, Japan

[73] Assignee: Tokyo Electron Limited, Tokyo, Japan

[21] Appl. No.: 08/996,036

[22] Filed: Dec. 22, 1997

[30] Foreign Application Priority Data

Dec. 27, 1996 [JP] Japan .................................. 8-357665

[51] Int. Cl.[7] .................................................. G01R 31/02
[52] U.S. Cl. ........................ 324/754; 324/758; 324/158.1
[58] Field of Search .................................... 324/754, 755, 324/758, 759, 765, 158.1

[56] References Cited

U.S. PATENT DOCUMENTS

| | | | |
|---|---|---|---|
| 5,068,601 | 11/1991 | Parameter | 324/754 |
| 5,254,939 | 10/1993 | Anderson et al. | 324/754 |
| 5,264,787 | 11/1993 | Woith et al. | 324/754 |
| 5,471,148 | 11/1995 | Sinsheimer et al. | 324/754 |
| 5,517,126 | 5/1996 | Yamaguchi | 324/758 |
| 5,528,158 | 6/1996 | Sinsheimer et al. | 324/754 X |
| 5,640,100 | 6/1997 | Yamagata et al. | 324/758 X |
| 5,912,555 | 6/1999 | Akaike et al. | 324/158.1 |

FOREIGN PATENT DOCUMENTS

7-19815  3/1995  Japan .

*Primary Examiner*—Diep N. Do
*Assistant Examiner*—T. R. Sundaram
*Attorney, Agent, or Firm*—Oblon, Spivak, McClelland, Maier & Neustadt, P.C.

[57] ABSTRACT

A probe card attaching mechanism fits a probe card to a prober that checks electric characteristics of an object to be tested (e.g., an integrated circuit formed on a semiconductor wafer). The probe card has measurement contactors which are to be brought into contact with the electrodes of the object. The probe card attaching mechanism is provided with a fixing ring, a ring-like card holder, and a lock ring. The fixing ring is secured at an opening section that is on top of the casing of the prober. The fixing ring has a reference surface on the lower side thereof. The card holder is adapted to hold the probe card. The card holder has a reference surface on the upper side and a number of driven portions of cam mechanisms on the outer circumference. The lock ring is provided on the lower side of the fixing ring and is rotatable in both a normal direction and a reverse direction. The lock ring has driving portions of the cam mechanisms, and the driving portions cooperate with the driven portions of the card holder. In accordance with the rotation of the lock ring, its driving portions raise the driven portions of the card holder. Accordingly, the reference surface of the card holder is pressed tightly against the reference surface of the fixing ring, and the card holder is made immovable thereby.

15 Claims, 7 Drawing Sheets

PROBE CARD ATTACHING MECHANISM

BACKGROUND OF THE INVENTION

The present invention relates to a prober for examining the electric characteristics of an electronic element by use of a probe card that has probes arranged in accordance with the arrangement of the electrodes of the electronic element, and specifically to a mechanism for attaching the probe card to the prober.

To be more specific, the present invention is directed to a mechanism for attaching a probe card to a prober designed to examine the electric characteristics of an integrated circuit formed on a semiconductor wafer.

The present invention will be described below, referring to the case where it is applied to a prober designed for examining an integrated circuit on a wafer, but the invention is in no way limited to such a case. That is, the present invention is applicable to all types of probers that are designed for examining the electric characteristics of various electronic elements (objects to be examined) by use of a probe card. In other words, the present invention is not limited to a mechanism for attaching a probe card to a prober that is merely designed for checking an integrated circuit on a semiconductor wafer.

Figure 7:
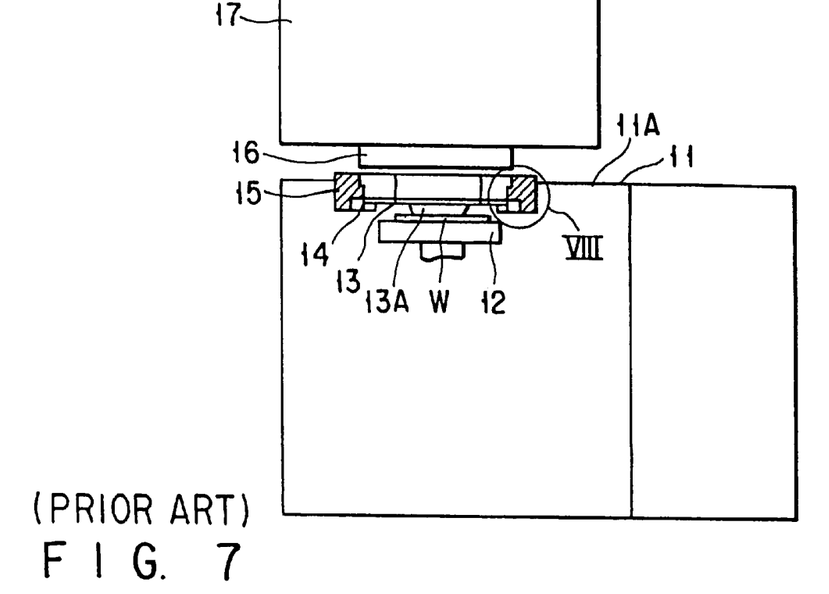
FIG. 7 shows the major portion of a conventional prober.

An example of a conventional prober for checking an integrated circuit formed on a wafer is shown in FIG. 7. As shown in this FIGURE, the conventional prober comprises: a casing 11; a susceptor 12, arranged inside the casing 11 and movable in X-, Y-, Z- and θ-directions, for holding a wafer W to be checked; a probe card 13 having probes 13A arranged in correspondence to the electrode pads of integrated circuits formed on the wafer W on the susceptor 12; an insert ring 15 used for securing the probe card 13 to a card holder 14; and a connection ring 16 for electrically connecting the probe card 13 secured by means of the insert ring to a test head 17. The electrode pads of the integrated circuits on the wafer W are positioned with reference to the corresponding probes 13A by adjusting the position of the susceptor 12. Subsequently, the integrated circuits are electrically examined by exchanging test signals between a tester (not shown) and the integrated circuits through the probe card 13, the connection ring 16 and the test head 17.

The probe card 13 can be replaced with another in an automatic or semiautomatic fashion. For this replacement, the insert ring 15 is provided with an automatic or semiautomatic probe card attaching mechanism (hereinafter referred to simply as a attaching mechanism). By this attaching mechanism, the probe card 13 is fitted to a clamp and removed therefrom.

Figure 8:
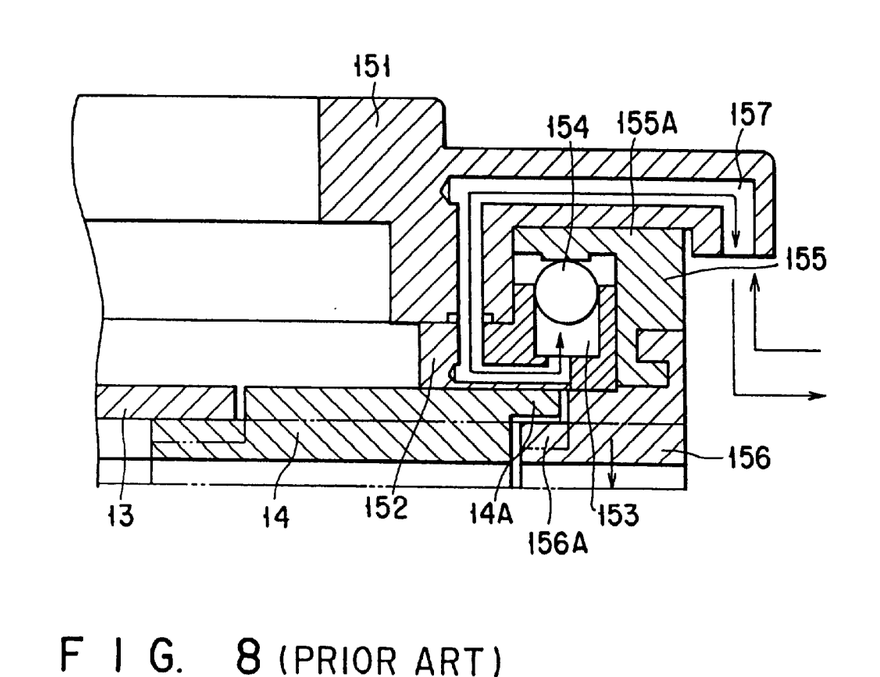
FIG. 8 is an enlarged sectional view showing the major portion of the insert ring of the prober shown in FIG. 7.

The attaching mechanism has such a structure as is shown in FIG. 8. This FIGURE is an enlarged view showing details of the portion that is inside the circle indicated in FIG. 7. As shown in FIG. 8, the attaching mechanism comprises a fixing ring 151 secured at an opening of a head plate 11A, a cylinder ring 152 fitted with the lower side of the fixing ring 151 and having an annular groove formed throughout the circumference of the upper side thereof, and an O-ring 154 fitted in the annular groove to define an airtight chamber 153. A piston ring 155 is vertically movable along the outer face of the cylinder ring 152. The piston ring 155 has a flange 155A, and this flange 155A pushes the O-ring 154. A card-receiving ring 156 engages with the outer surface of the piston ring 155 and is rotatable in the circumferential direction.

The card-receiving ring 156 has a plurality of engagement sections 156A on the inner circumferential surface thereof. The engagement sections 156A are arranged at equal intervals in the circumferential direction and are projected radially inward. The card holder 14 has a plurality of engagement sections 14A on the outer circumferential surface thereof. The engagement sections 14 are arranged at equal intervals in the circumferential direction and projected radially outward. Each of the engagement sections 14A of the card holder 14 is located between the corresponding engagement sections 156A of the card-receiving ring 156. When the card-receiving ring 156 rotates in the circumferential direction, its engagement sections 156A are brought into engagement with the corresponding engagement sections 14A, thereby permitting the card-receiving ring 156 to hold the card holder 14.

A passage 157 for allowing communication between the airtight chamber 153 and an outside region is defined. As shown in FIG. 8, the passage extends along the fixing ring 151 and the cylinder ring 152. An air supply source (not shown) is connected to the passage 157. From the air supply source, compressed air is supplied through the passage 157 into the airtight chamber 153. When the compressed air is supplied into the airtight chamber 153, the pneumatic pressure raises the O-ring 154 together with the piston ring 155, thereby permitting the card ring 156 and the cylinder ring 152 to hold the card holder 14 in the fitted state. For automatic or semiautomatic replacement of the probe card 13, the compressed air is discharged from the airtight chamber 153. Since the piston ring 155 is lowered together with the card ring 156, the card holder 14 is separated from the cylinder ring 152. In this state, the card-receiving ring 156 is rotated, thereby releasing the engagement between the engagement sections 14A of the card holder 14 and the engagement sections 156A of the card-receiving ring 156. Accordingly, the probe card 13 becomes ready for replacement.

In the conventional proper described above, the insert ring 15 constitutes a attaching mechanism. The attaching mechanism 15 raises the piston ring 155 and the card holder 14 by utilization of the pneumatic pressure in the airtight chamber 153 of the cylinder ring 152, and the probe card 13 is fitted and held by the lower side of the cylinder ring 152 and the card-receiving ring 156. With the attaching mechanism, it is hard to lift the probe card 13 exactly in the vertical direction. In other words, the probe card 13 is likely to slant though slightly when it is being lifted. The probe card 13 does not slant greatly if it is the one designed for examining a wafer whose diameter is in the range of 6 to 8 inches. However, the probe card 13 does slant greatly if it is for examining a large-diameter wafer (e.g., a 12" wafer) since such a probe card is also large in diameter. If a large-diameter probe card slants, it may touch pogopins. That is, the pogopins on the lower side of the connection ring 16 may not be in uniform contact with the terminals of the probe card 13. If this occurs, the pogopins is applied with an overload and may be damaged. In addition, some of the pogopins may not be in reliable contact with the probe card 13, and the test may not be executed in a satisfactory manner.

BRIEF SUMMARY OF THE INVENTION

The present invention has been developed to solve the problems mentioned above, and an object of the present invention is to provide a technique for attaching a probe card to a fixed ring smoothly and preventing the probe card from slanting.

Another object of the present invention is to provide a probe card attaching mechanism which allows the connection terminals of a probe card to be in uniform contact with the pogopins, prevents an excessive force from being applied to the pogopins, thereby avoiding damage to the pogopins, and enables a test to be reliably executed at all times.

The inventions described in claims 1 to 11 concern a probe card attaching mechanism for attaching a probe card to a prober that checks electric characteristics of an object to be tested. The probe card has measurement contactors which are to be brought into contact with electrodes of the object. The probe card attaching mechanism comprises: a fixing ring secured at an opening section of the casing of the prober and having a reference surface at the bottom thereof; a ring-like card holder used for holding the probe card and having a reference surface on top thereof and a plurality of movable portions on an outer circumference thereof, the movable portions constituting part of a plurality of cam mechanisms; and a lock ring provided on the lower side of the fixing ring and being rotatable in both a normal direction and a reverse direction, the lock ring having movable portions which cooperate with the movable portions of the card holder and constitute part of the cam mechanisms. When the lock ring rotates in the normal direction, its movable portions cooperate with the movable portions of the card holder and raise the card holder until the reference surface of the card holder is pressed tightly against the reference surface of the fixing ring. Accordingly, the card holder is made immovable thereby. When the lock ring rotates in the reverse direction, the movable portions of the lock ring and the movable portions of the card holder disengage from each other, and the card holder is separated from the fixing ring.

According to claim 2, means for rotatably coupling the lock ring to the lower side of the fixing ring is further provided. The coupling means includes at least one grooved pulley rotatably fitted around a shaft secured to the fixing ring, and at least one groove formed in the inner circumferential portion of the lock ring. The lock ring is rotatable under the fixing ring by engaging the groove formed in the grooved pulley with the groove of the lock ring.

According to claim 3, the groove formed in the pulley has a "V" shape, and the groove formed in the lock ring has an inverted-"V" shape which is engageable with the groove formed in the grooved pulley.

According to claim 4, the means for rotatably coupling the lock ring to the lower side of the fixing ring employs a plurality of shafts secured to the fixing ring and a plurality of rotating members which are coupled to the fixing ring to be rotatable in two directions. The shafts are eccentric with reference to the rotating members. The rotating members are rotated to adjust the positions of the shafts. Those grooves of the pulleys into which the shafts are fitted and those grooves formed in the lock ring are engaged or disengaged from each other.

According to claim 5, the lock ring, provided on the lower side of the fixing ring, is rotatable in two opposite directions by means of one or a number of air cylinders.

According to claim 6, the lock ring includes an upper ring, a lower ring and means for elastically pressing the rings against each other. The upper ring has means for securing the lock ring to the fixing ring and the lower ring has second movable portions constituting the cam mechanisms.

According to claim 7, the fixing ring includes a plurality of guiding means, located on a lower side thereof, for guiding a card holder to a predetermined position. The card holder includes a plurality of to-be-guided means, which are guided by the guiding means.

According to claim 8, each of the guiding means of the fixing ring is a guide pin projected downward from the lower side of the fixing ring, and each of the to-be-guided means of the card holder is an inversely conical hole.

According to claim 9, the guide pins of the fixing ring have different diameters.

According to claim 10, the lock ring releases the card holder from the held state at a disengagement position where the movable portions of the cam holder and the second movable portions of the lock ring are not in engagement. The fixing ring is provided with means for applying the card holder with an elastic force that permits the card holder to separate from the lock ring. At the disengagement position, the card holder is forcibly separated from the lock ring by the elastic force-applying means.

According to claim 11, the elastic force-applying means of the fixing ring is a spring.

The inventions described in claims 12 to 18 concern a probe card attaching mechanism for attaching a probe card to a prober that checks electric characteristics of integrated circuits formed on a semiconductor wafer. The probe card having measurement contactors which are to be brought into contact with the electrodes of the integrated circuits. The probe card attaching mechanism comprises: a fixing ring secured at an opening section of the casing of a prober and having a reference surface at the bottom thereof; a ring-like card holder used for holding the probe card and having a reference surface on top thereof and a plurality of movable portions on an outer circumference thereof, the movable portions constituting part of a plurality of cam mechanisms; a lock ring provided on the lower side of the fixing ring and being rotatable in both a normal direction and a reverse direction, the lock ring having second movable portions which cooperate with the movable portions of the card holder and constitute part of the cam mechanisms; and means for coupling the lock ring to the lower side of the fixing ring to be rotatable in both a normal direction and a reverse direction. When the lock ring rotates in the normal direction, its movable portions cooperate with the movable portions of the card holder and raise the card holder until the reference surface of the card holder is pressed tightly against the reference surface of the fixing ring, and the card holder is made immovable thereby. When the lock ring rotates in the reverse direction, the movable portions of the lock ring and the movable portions of the card holder disengage from each other, and the card holder is separated from the fixing ring.

According to claim 13, the means for rotatably coupling the lock ring to the lower side of the fixing ring includes grooved pulleys into which shafts secured to the fixing ring are rotatably fitted. Each grooved pulley has at least one groove. The means for rotatable coupling also includes at least one groove formed in the inner circumferential portion of the lock ring. The lock ring is rotatably coupled to the fixing ring by engaging the grooves of the grooved pulleys with the groove or grooves of the lock ring.

According to claim 14, the means for rotatably coupling the lock ring to the lower side of the fixing ring employs a plurality of shafts secured to the fixing ring and a plurality of rotating members which are coupled to the fixing ring to be rotatable in two directions. The shafts are eccentric with reference to the rotating members. The rotating members are rotated to adjust the positions of the shafts. Those grooves of the pulleys into which the shafts are fitted and those grooves formed in the lock ring are engaged or disengaged from each other.

According to claim 15, the lock ring includes an upper ring, a lower ring and means for elastically pressing the rings against each other. The upper ring has means for securing the lock ring to the fixing ring, while the lower ring has second movable portions constituting the cam mechanisms.

According to claim 16, the fixing ring includes a plurality of guide pins, located on a lower side thereof, for guiding a card holder to a predetermined position. The card holder has a plurality of inversely conical holes. Each guide pin serves as a guiding means, and each inversely-conical hole serves as a to-be-guided means.

According to claim 17, the lock ring releases the card holder from the held state at a disengagement position where the movable portions of the cam holder and the second movable portions of the lock ring are not in engagement. The fixing ring is provided with means for applying the card holder with an elastic force that permits the card holder to separate from the lock ring. At the disengagement position, the card holder is forcibly separated from the lock ring by the elastic force-applying means.

According to claim 18, the guide pins of the fixing ring have different diameters.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The present invention is applied to a prober that measures the electric characteristics of all types of electronic elements (i.e., objects to be measured) by use of a probe card. Therefore, the invention is not limited to a probe card attaching mechanism that is employed in a prober for checking integrated circuits formed on a semiconductor wafer. For easy understanding of the present invention, the following descriptions will be given of the case where the invention is applied to a prober adapted for checking integrated circuits formed on a semiconductor wafer.

Figure 1:
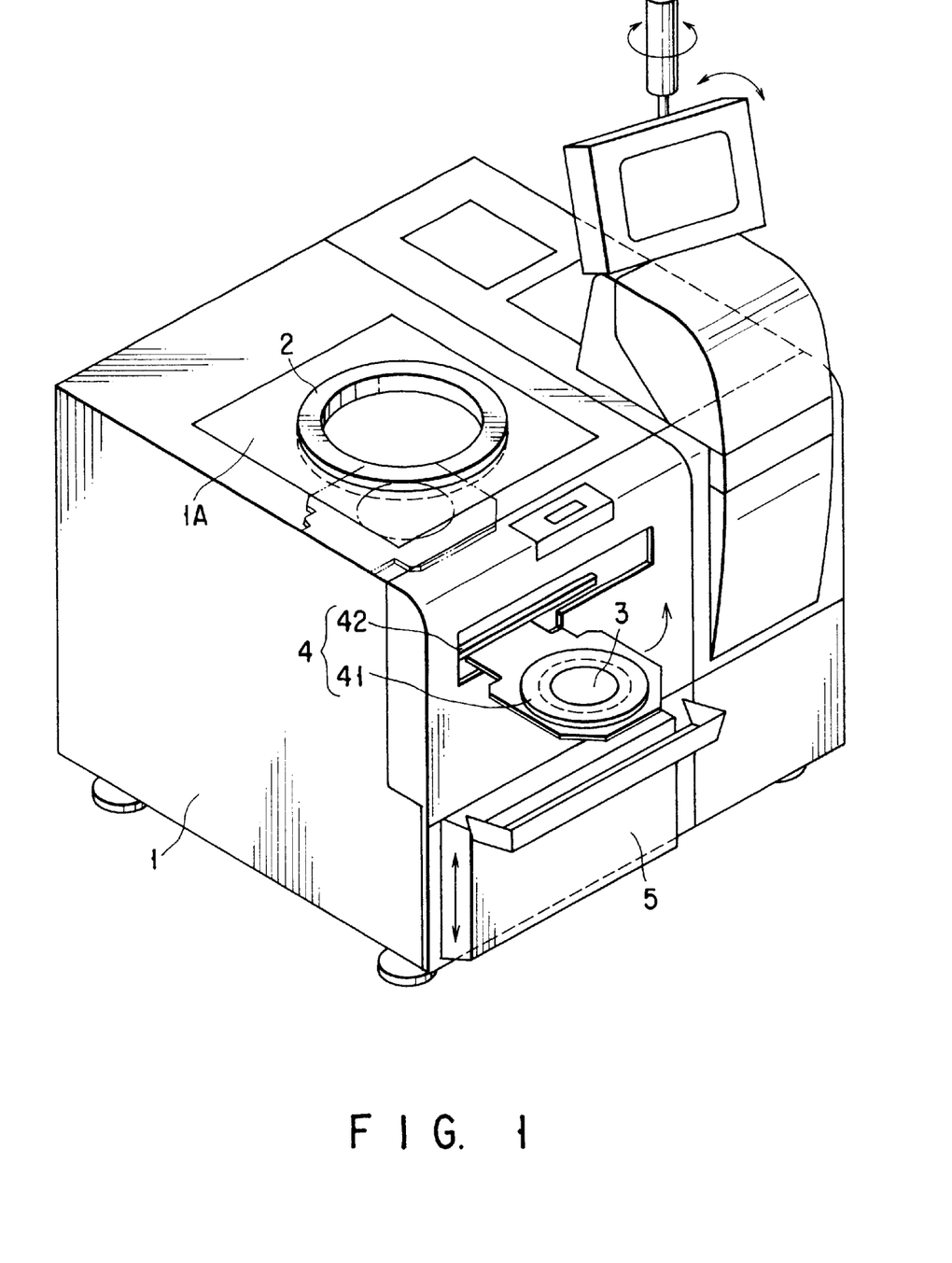
FIG. 1 is a perspective view showing a prober according to one embodiment of the present invention.

Referring to FIGS. 1–6, a prober according to an embodiment of the present invention is essentially similar in structure to the conventional prober described above, except the structure of the insert ring. Therefore, the descriptions given below will be directed mainly to the features that are unique to the prober of the embodiment of the present invention, and reference to structures similar to those of the conventional prober will be omitted. As shown in FIG. 1, the prober of the embodiment comprises a casing 1, an insert ring 2 secured at the opening section of the head plate 1A of the casing 1, and a card transfer mechanism 4 for conveying a probe card 3 to the insert ring 2. The card transfer mechanism 4 is a semiautomatic type and is capable of replacing the presently-loaded probe card 3 with another in a semiautomatic manner.

The card transfer mechanism 4 is foldable in front of the casing 1.

The card transfer mechanism 3 is provided with a tray 41, an arm 42 and a driving mechanism (not shown). The tray can suck and hold the probe card 3 thereon by utilization of vacuum. The arm 42 can support the tray 41 in such a manner that the tray 41 can stand upright or lie horizontally. The driving mechanism can move the arm 42 between a position which is in front of the casing 1 and a position which is just under the insert ring 2. In addition, the driving mechanism can lift the arm 42 when this arm is at the position just under the insert ring 2. The tray 41 is conveyed, with the probe card 3 held thereon. In FIG. 1, reference numeral 5 denotes a cover used for covering the tray 41 in front of the casing 1, and the cover 5 is vertically movable.

The insert ring 2 is provided with a probe card attaching mechanism that can clamp the probe card 3 or release it in an automatic or semiautomatic manner. In other words, the insert ring 2 serves as a clamp mechanism. In the descriptions below, therefore, the insert ring 2 will be referred to as a clamp mechanism when the use of this term is necessary or desirable for easy understanding.

Figure 2:
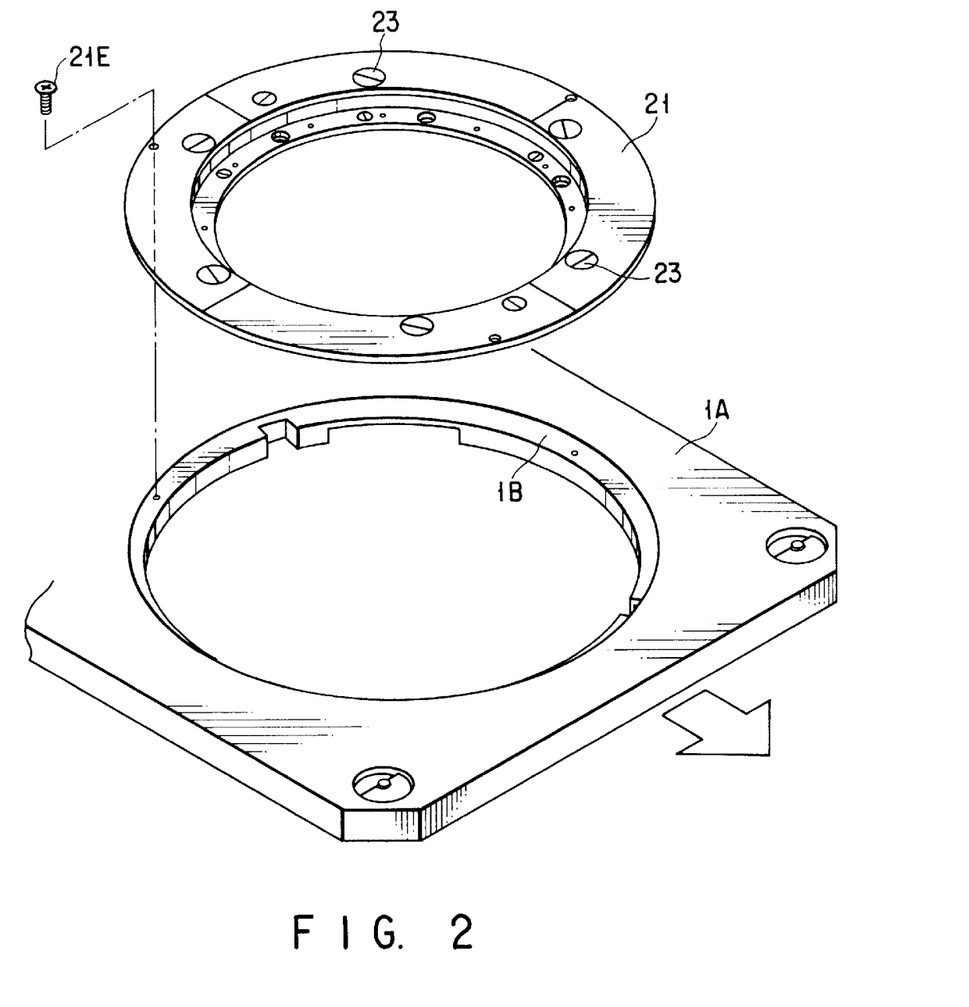
FIG. 2 is a perspective view showing how the fixing ring of the insert ring depicted in FIG. 1 is assembled with reference to a head plate.
Figure 3A:
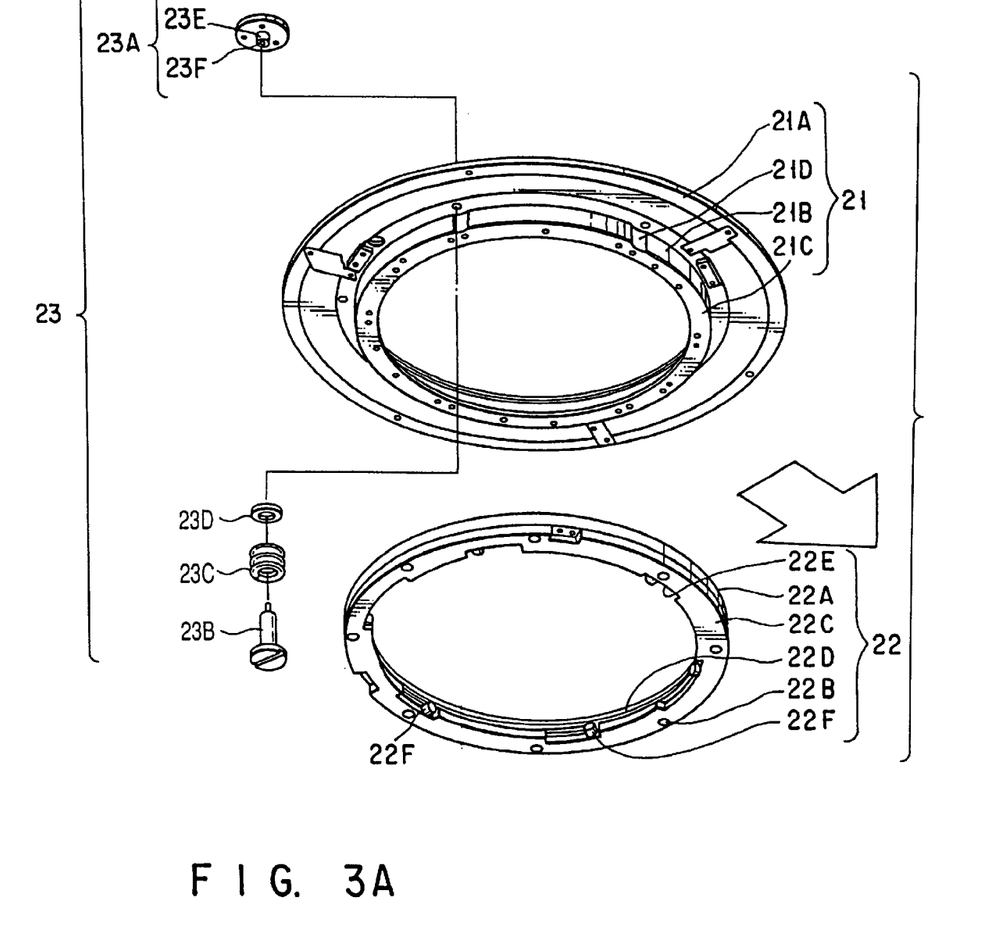
FIG. 3A is an exploded perspective view that illustrates the detailed structure of the insert ring depicted in FIG. 1, and represents how the fixing ring, a lock ring and a V-pulley are related with one another.

As shown in FIGS. 2 and 3A, the clamp mechanism 2 is made up of a fixing ring 21, a lock ring 22 and a number of grooved pulleys. The fixing ring 21 is secured to the flange 1B of the head plate 1A of the casing 1. The lock ring 22 is attached on the lower part of the fixing ring 21 in such a manner that the lock ring 22 is concentric with the fixing ring 21. The lock ring 22 is rotatable in two directions with reference to the fixing ring 21. The grooved pulleys 23 are used for rotatably coupling the lock ring 22 to the fixing ring 21. The grooved pulleys 23 are specifically V-pulleys in the present embodiment, and the number of V-pulleys employed in the embodiment is six, for example. In FIG. 3, only one V-pulley is shown, for simplicity.

As shown in FIGS. 2 and 3A, the fixing ring 21 is made up of a flange section 21A engageable with the flange 1B of the head plate 1A, a flat cylindrical section 21B extending downward from the inner circumference of the flange section 21A, and a flange-like clamp 21C expanding radially inward from the lower edge of the cylindrical section 21B. As described later, the clamp section 21C cooperates with the lock ring 22 to clamp a card holder-engaging flange. Six "U"-shaped depressions 21D are formed in the outer circumference of the cylinder section 21B such that they are spaced at regular intervals in the circumferential direction. V-pulleys 23 are rotatably arranged inside the respective depressions 21D. The V-pulleys jointly constitute means for holding the lock ring 22 in such a manner as to be rotatable in two directions. When the probe card 3 is fixed by means of the clamp section 21C, the flat lower face of the clamp section 21C is brought into contact with the corresponding flat face of the probe card 3 and thus serves as a reference face for positioning the probe card 3. As shown in FIG. 2, the fixing ring 21 is fixed to the head plate 1A by means of screws 21E.

Figure 4:
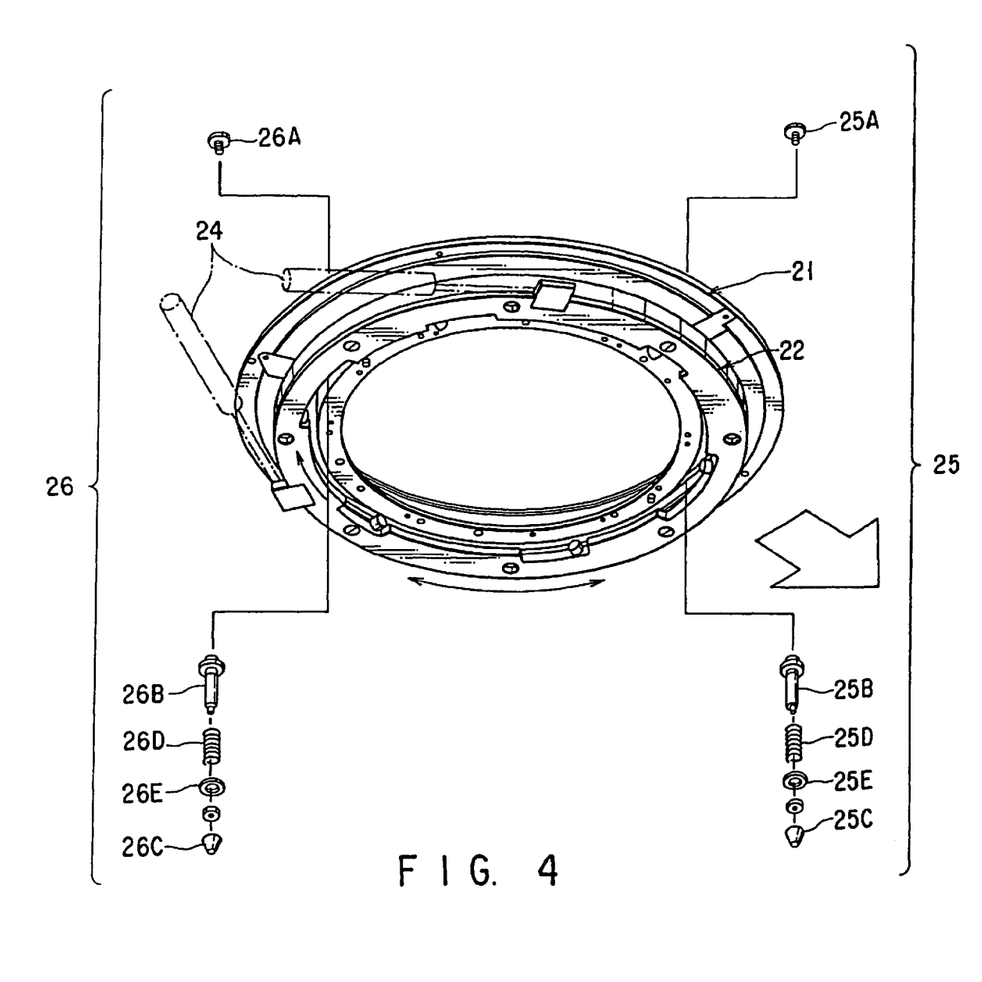
FIG. 4 is a perspective view showing how the guide mechanism of the insert ring depicted in FIG. 1 is assembled.

As can be seen from FIGS. 3A and 4, the inner diameter of the lock ring 22 is so determined as to permit the cylindrical section 21B of the fixing ring 21 to be fitted in the lock ring 22. The lock ring 22 is attached to the fixing ring 21 by means of V-pulleys 23, as shown in FIG. 3A.

The V-pulleys 23 will be explained. As shown in FIG. 3A, each V-pulley 23 is made up of the following: a rotating member 23A (e.g., a bearing nut) which is attached to the upper face of the fixing ring 21, a bearing pin 23B which is threadably inserted into the bearing nut 23A from under the fixing ring 21, a rotatable pulley 23C into which the bearing pin 23B is inserted, and a spacer 23D used for adjusting the height of the pulley 23C. A shaft 23E is provided at the center of the bearing nut 23A, and that shaft is inserted into the corresponding hole of the fixing ring 21. The shaft 23E has a female screw portion 23F with which the bearing pin 23B is threadably engages. The female screw portion 23F is slightly eccentric with reference to the axis of the bearing nut 23A. Therefore, the axis of the bearing pin 23B is slightly shifted from the axis of the bearing nut 23A. After the V-pulley 23 is attached to the fixing ring 21 by means of the bearing nut 23A, the bearing nut 23A is rotated, with the shaft 23E as a center. When the outer circumferential face of the pulley 23C engaged with a V groove (to be mentioned later) formed in the inner circumferential face of the lock ring 22, the lock ring 22 is rotatably coupled to the fixing ring 21. When the outer circumferential face of the pulley 23C is away from the V groove, the fixing ring 21 is released from the lock ring 22.

Figure 3B:
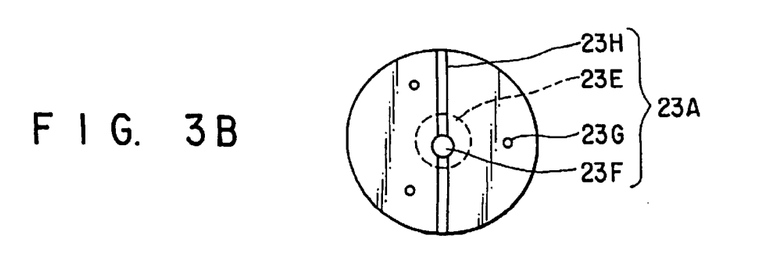
FIG. 3B is a plan view that illustrates the detailed structure of the insert ring depicted in FIG. 1 and represents the bearing nut of the V-pulley.
Figure 5A:
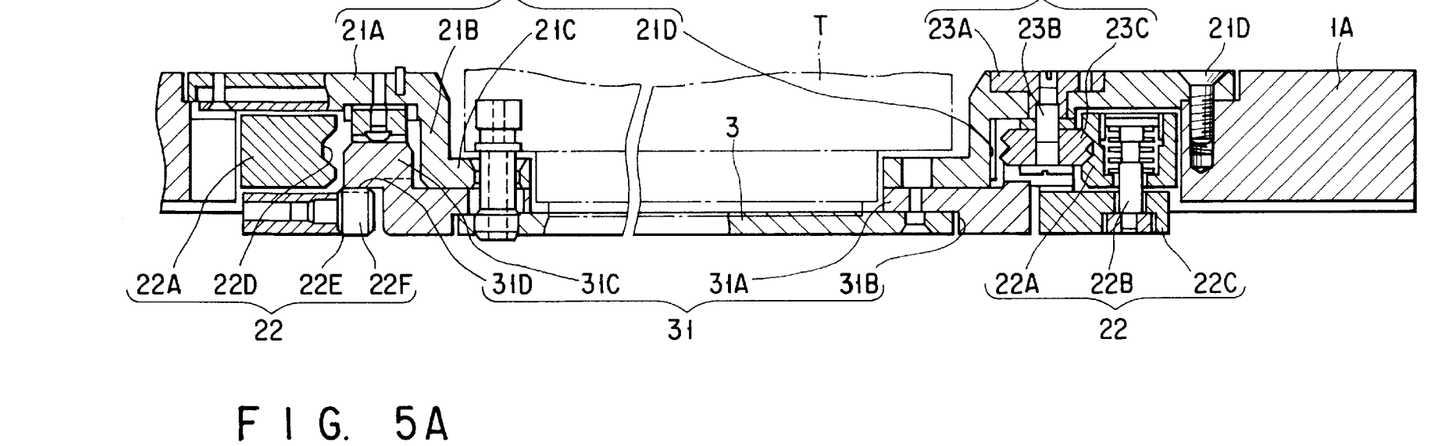
FIG. 5A is a sectional view illustrating the relationships between the insert ring depicted in FIG. 1 and a probe card, the sectional view showing how the probe card is fixed inside the insert ring, with the relationships between a cam follower and a cam and those between the lock ring and the V-pulley being depicted.
Figure 5B:
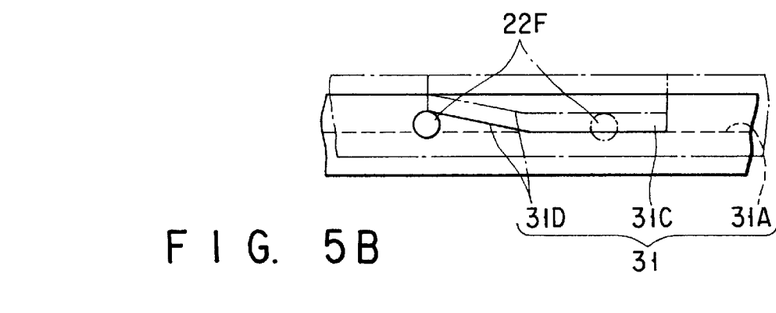
FIG. 5B shows the relationships between the insert ring depicted in FIG. 1 and the guide mechanism by illustrating how the cam follower and cam of the lock ring operate.
Figure 6:
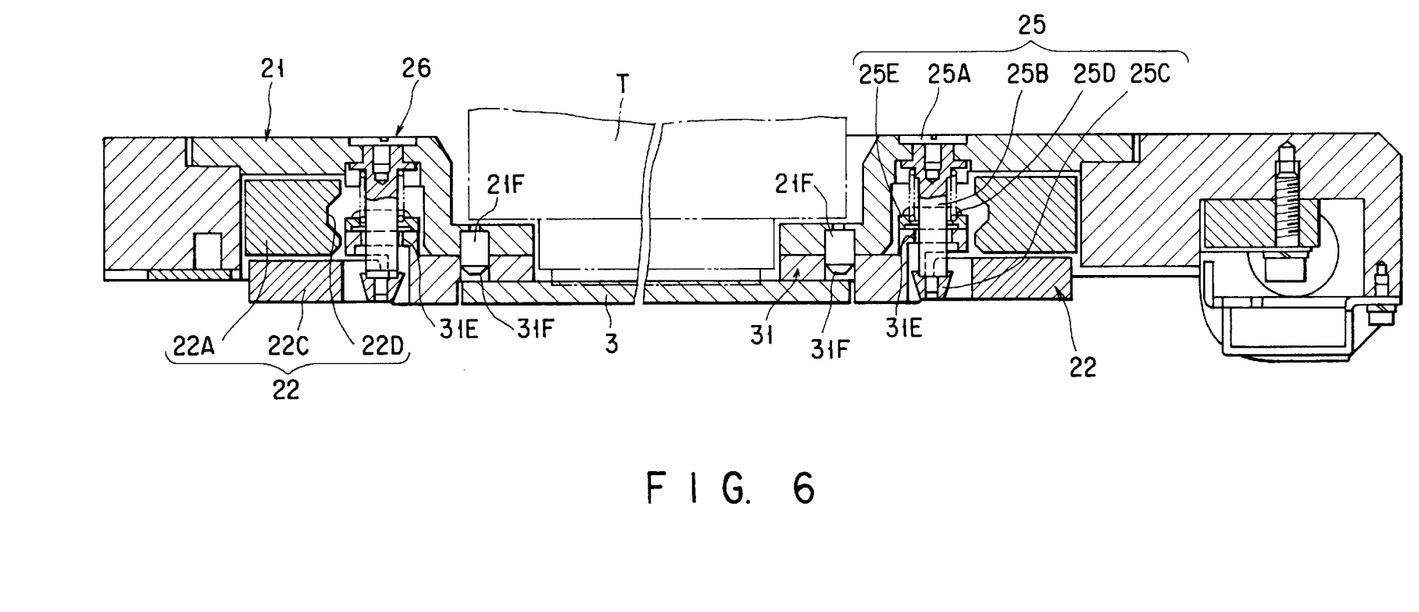
FIG. 6 is a sectional view showing how the probe card is fixed inside the insert ring depicted in FIG. 1 and illustrates how the guide mechanism is assembled.

To attach the lock ring 22 to the fixing ring 21, the bearing nut 23A is rotated until the pulley 23C is separate from the inner circumferential face of the lock ring 22. In this state, the lock ring 22 is fitted inside the fixing ring 21, and the bearing nut 23A is rotated in the opposite direction until the pulley 23C is brought into engagement with the inner circumferential face of the lock ring 22. As shown in FIGS. 4–6, the lock ring 22 is rotatable with reference to the fixing ring 21. When the lock ring 22 is rotatable with reference to the fixing ring 21, the direction of the bearing nut 23A is indicated by the direction of a jig groove 23H (FIG. 3B). In this FIGURE, reference symbol 23G denotes a hole used when the V-pulley 23 is secured to the fixing ring 21.

The lock ring 22 is made up of an upper ring 22A and a lower ring 22C. The upper and lower rings 22A and 22C are coupled together as one body by means of a plurality of coupling pins 22B, utilizing the spring force generated by an elastic member (which surrounds pins 22B shown in FIG. 5A). As shown in FIGS. 3A–6, the upper ring 22A engages with the flange section 21A of the fixing ring 21 at the radially inward portion thereof. The lock ring 22 can be rotated in two directions by a number of air cylinders 24 (FIG. 4). Although two air cylinders 24 are depicted in FIG. 4, three or more air cylinders may be employed. Alternatively, a single air cylinder may be employed, if so desired.

The inner diameter of the upper ring 22A is greater than that of the lower ring 22C (see FIG. 5A), and the inner diameter of the lower ring 22C is greater than the outer diameter of the cylindrical section 21B of the fixing ring 21. The upper and lower rings 22A and 22C have holes into which the coupling pins 22B are inserted. The holes are arranged at equal intervals in the circumferential direction of the rings 22A and 22C.

The upper ring 22A has a groove (e.g., a V-shaped groove) 22D formed in the inner circumference thereof, and the six V-pulleys 23 are fitted in the groove 22D. Due to the use of the V-pulleys 23, the lock ring 22 is rotatably held by the fixing ring 21. The lower ring 22 have six notches 22E formed in the inner circumferential surface thereof and arranged at equal intervals in the circumferential direction. The flange for engagement with the card holder 31 is allowed to pass through each of the notches 22E. To be more specific, when the card transfer mechanism 4 rises just under the insert ring 2 for a distance of 67 mm, for example, and thereby lifts the probe card 3, a cam section 31D (which is a movable section of the card holder 31 and serves as a driven portion of the cam mechanism) can pass through the notches 22E of the lock ring 22 without touching a cam follower 22F (which serves as a second movable section of the cam mechanism). The cam follower 22F is radially projected from the inner circumferential surface of each notch 22E. In each notch 22E, the cam follower 22F is eccentric in one direction (in the counterclockwise direction in the case shown in FIGS. 3A and 4). The cam follower 22F is made of a rotatably-supported roller. When the cam follower 22F rotates and moves the cam 31D of the flange that engages with the card holder 31, the probe card 3 is lifted in the vertical direction.

As shown in FIGS. 5A and 6, the card holder 31 has an inner flange 31A formed in the inner circumferential surface thereof. The upper portion of this inner flange 31A is tightly pressed against the lower portion (the reference surface) of the clamp section 21C, so that the surface of the upper portion serves as a reference surface used for positioning the card holder 31 with reference to the fixing ring 21. The inner flange 31A has a stepped section 31B at the lower portion thereof, and the probe card 3 is fitted in the stepped section 31B. The card holder 31 has engagement flanges 31C on the upper side of the outer circumference thereof in such a manner that the engagement flanges 31C correspond to the notches 22E of the lock ring 22. The lower half of each engagement flange 31C has a slanted surface, while the upper half has a parallel surface that is parallel to a member located just above.

The slanted-surface portion is specifically a cam 31D (i.e., a driven portion of the cam mechanism) along which the cam follower 22F (i.e., a driving portion of the cam this mechanism) of the lock ring 22 rolls. When the engagement flanges 31C are fitted in the corresponding notches 22E, the cam 31D is located in the vicinity of the cam follower 22F. As shown in FIG. 6, the opposing pair of engagement flanges 31C are provided with guide holes 31E of different diameters, which serve as to-be-guided means. In cooperation with the guide means of the fixing ring 21 (the guide means being constituted by elements 25 and 26 to be described later), the guide holes 31E serve to position the card holder 31 and probe card 3 with reference to the fixing ring 21 and set them at the predetermined position. The upper portion of the inner circumferential wall of each guide hole 31E defines an inversely conical rest.

The card transfer mechanism 4 lifts the card holder 31 and the probe card 3 toward the fixing ring 21. The air cylinders 24 (FIG. 4) rotate the lock ring 22 clockwise, and the six cam followers 22F roll from the solid-line positions of the engagement flange 31C to the one-dot-dash-line position thereof and thus engage with the respective cams 31D, as shown in FIG. 5B. In this state, the lock ring 22 is kept rotated. Due to this rotation of the lock ring 22, the cam followers 22F move while being guided by the cams 31D, and thus lift the probe card 3 without slanting it. When the cam followers 22F reach the parallel-surface portions of the corresponding engagement flanges 31C, the upper surface (reference surface) of the inner flange 31A is pressed tightly against the lower surface (reference surface) of the clamp section 21C of the fixing ring 21. Accordingly, the card holder 31 and the probe card 3 are fitted at the predetermined position of the fixing ring 21, as shown in FIG. 5A.

The fixing ring 21 has guide means 25 and 26. In the embodiment shown in FIGS. 4 and 6, the guide means 25 and 26 are two guide pins (25B) extending downward from the fixing ring 21. The guide pins are different in thickness. Means for applying an elastic force to the card holder is provided around each guide pin. (In the embodiment, the elastic force-applying means is a spring 25D.) When the probe card 3 is released from the locked state, the card holder 31 is ejected onto the card transfer mechanism 4 by the spring 25D.

Since the guide means or mechanisms 25 and 26 are of the same structure, a description will be given only of guide mechanism 25. In FIG. 4, the other guide mechanism 26 is represented by use of reference symbols corresponding to those of guide mechanism 25, and reference to guide mechanism 26 will be omitted. The reason for employing different-size guide mechanisms is to prevent the probe card 3 from being fitted in the wrong direction.

Guide mechanism 25 comprises a guide bolt 25A attached to the fixing ring 21, a guide pin 25B screwed to the bolt 25A and extending downward from the fixing ring 21, a guide means 25C fixed to the lower end of the guide pin 25B (the guide means is a conical member in the embodiment shown in FIG. 4), a spring 25D provided between the guide bolt 25A and the guide means 25C, and a spring receiver 25E located at the lower end of the spring 25D. The spring receiver 25E is pressed against the card holder 31 at all times, due to the spring force generated by the spring 25D.

When the card holder 31 is lifted toward the fixing ring 21 so as to fit the probe card 3 onto the fixing ring 21, the guide pin 25B of the guide means 25 of the fixing ring 21 is inserted into the to-be-guided means (the guide hole) of the engagement flange 31C of the card holder 31. Since the upper portion of the inner circumferential wall of each guide hole 31E is tapered and the circumferential surface of the guide member 25C at the tip end of the guide pin 25B is also tapered, the card holder 31 is reliably guided to the intended position on the fixing ring 21 even if the guide pin 25B is shifted from the guide hole 31E more or less. To detach the card holder 31 from the fixing ring 21, the lock ring 21 is rotated in the opposite direction to that in which it is rotated at the time of assembly. By this rotation of the lock ring 21, the cam followers 22F and the cams 31D are disengaged from each other and are therefore released from the locked state. Accordingly, the card holder 31 is ejected from the fixing ring 21 due to the urging force of the spring 25D of the guide mechanism 25. As can be seen from FIG. 6, the clamp section 21C of the fixing ring 21 has a number of guide pins 21F. The inner flange 31A of the card holder 31 has a number of guide holes 31F such that the guide holes 31F correspond in position to the guide pins 21F. The positioning of the card holder 31 with reference to the fixing ring 21 is accomplished by inserting the guide pin 21F into the guide hole 31F.

A description will now be given of the operation of the subject probe card attaching mechanism. To replace the presently-used probe card 3 with a new one, the tray 41 of the card transfer mechanism 4 is made level, as indicated in FIG. 1. Then, the arm 42 rotates counterclockwise for about 100° and stops when the tray 41 comes to the position just under the fixing ring 2. Subsequently, the arm 42 rises. The air cylinders 24 rotate the lock ring 22 counterclockwise relative to the fixing ring 21 and the card holder 31. The six cam followers 22F, which are arranged at equal intervals in the circumferential direction of the lock ring 22, move from the one-dot-dash-line position to the solid-line position (see FIG. 5B). In other words, each cam follower 22F moves from the parallel surface of the engagement flange 31C while rolling along the corresponding cam 31D and comes to the position which is away from the engagement flange 31C. Due to the elastic force generated by the springs 25D and 26D of the two guide mechanisms 25 and 26 of the fixing ring 21, the card holder 31 is ejected from the fixing ring 21. In this manner, the card holder 31 holding the probe card thereon 3 is automatically ejected from the fixing ring 21 and moves onto the arm 42 of the card transfer mechanism 4.

Thereafter, the card transfer mechanism 4 is rotated in the opposite direction to convey the card holder 31 to a position outside of the casing 1. The card holder 31 held on the tray 41 is replaced with another card holder that holds the probe card 3 to be used next. The card transfer mechanism 4 rotates the tray 41 counterclockwise until the card holder 31 moves to the position just under the fixing ring 21. At that position, the tray rises. Owing to the engagement between the two guide mechanisms 25 and 26 and the guide holes 31E, the engagement flanges 31C of the card holder 31 are smoothly fitted in the notches 22E of the lock ring 22. Finally, the guide pins 21F of the fixing ring 21 are fitted in the guide holes 31F of the inner flange 31A of the card holder 31, and the card holder 31 is positioned accurately to the predetermined position on the fixing ring.

The air cylinders 24 rotate the lock ring 21 clockwise relative to the fixing ring 21 and the card holder 31. This rotation of the lock ring 21 causes the six cam followers 22F to move from the solid-line position to the one-dot-dash line position, as shown in FIG. 5B. In other words, the cam followers 22F roll along the cams 31D of the engagement flanges 31C, and the card holder 31 is lifted against the elastic force generated by the springs 25D and 26D of the guide mechanisms 25 and 26. When the cam followers 22F are brought into contact with the parallel surfaces of the cams 31D, the upper surface (reference surface) of the inner flange 31A of the card holder 31 is pressed tightly against the lower surface (reference surface) of the clamp section 21C of the fixing ring 21. As a result, the card holder 31 is fixed in the fixing ring 21. To be more specific, the card holder 31 is suspended from the lower ring 22C. The force with which to support the card holder 31 is dependent on the characteristics of the springs. That is, the elastic force of the springs are utilized to press the reference surface of the card holder 31 against the reference surface of the fixing ring 21 (i.e., the lower surface of the clamp section 21C). With this structure, the two reference surfaces are brought into contact with each other in a reliable manner without being adversely affected by the precision with which the parts are worked. As indicated by the one-dot-dash lines in FIGS. 5A and 6, when the test head T is brought into contact with the probe card 3 by the connection ring, all the pogopins of the connection ring are orientated in the direction perpendicular to the connection terminals of the probe card 3. Hence, damage to the pogopins are reliably prevented.

As described above, according to the present invention, the insert ring 2 comprises a fixing ring 21 secured to the head plate 1A, a lock ring 22 provided on the lower side of the fixing ring 21 and being rotatable in both a normal direction and a reverse direction, and air cylinders 24 for rotating the lock ring 22 in both the normal and reverse directions. The lock ring 22 has a number of notches 22E formed in the inner circumferential surface thereof, and the six engagement flanges 31C of the card holder 31 passes through the notches 22E. Each of the notches 22E has a cam follower 22F, and the lower portion of each engagement flange 31C has a slanted surface that serves as a cam 31D. When the probe card 3 is lifted from the position just under the insert ring 2, the six engagement flanges 31C of the card holder 31 are fitted in the notches 22E of the lock ring 22. The air cylinders 24 rotates the lock ring 22, and the cam followers 22F of the lock ring 22 roll along the cams 31D of the engagement flanges 31C. Accordingly, the card holder 31 and the probe card 3 can be lifted without being slanted. Finally, the card holder 31 is clamped by the fixing ring, and all the pogopins of the connection ring are brought into uniform contact with the connection terminals of the probe card 3 in a direction perpendicular thereto. Accordingly, the probe card attaching mechanism of the present invention ensures a stable test even in the case of a large-diameter wafer, and damage to the pogopins is prevented.

According to the present invention, the fixing ring 21 has six V-pulleys 23, and the lock ring 22 has V-grooves 22D which are formed in the circumferential surface thereof and into which the V-pulleys 23 into which the V-pulleys 23 are fitted. With this structure, the axis of each V-pulley 23 is adjusted, and the lock ring 22 and the fixing ring 21 can be coupled together as one body. The lock ring 22 can be easily assembled to the fixing ring 21 by adjusting the direction in which the V-pulleys 23 are orientated. In addition, the V-pulleys 23 enables the lock ring 22 to smoothly rotate.

The guide holes 31E of the card holder 31 and the guide mechanisms 25 and 26 of the fixing ring 21 (the guide mechanisms 25 and 26 include guide pins 25B and 26B and inversely conical guide members 25C and 26C) constitutes a guide system. By means of this system, the probe card 3 can be guided accurately to the intended position of the insert ring 2 even if the probe card 3 fails to be positioned just under the insert ring 2.

Since the guide mechanisms 25 and 26 include springs 25D and 26D which are inserted between the fixing ring 21 and the guide members 25C and 26C, the card holder 31 is ejected from the fixing ring 21 due to the urging force of the springs 25D and 26D at the time of detachment. In this manner, the detachment of the card holder 31 is automatic and is therefore easy.

The present invention is not limited to the embodiment mentioned above.

The probe card attaching mechanism of the embodiment described above is an automatic type. However, the present invention is not limited to this and is applicable to a manual type probe card attaching mechanism as well.

In the above description, the prober was explained based on the structure shown in FIG. 7 but is not limited to this type. Any type of prober can be employed as long as it employs a probe card having measurement contactors that are adapted for checking the electric characteristics of an object.

The fixing ring, the card holder and the lock ring are annular members, but both the inner and outer circumferences thereof need not be circular. They may be modified in shape unless the modifications to them adversely affect their original functions.

The fixing ring and the card holder have reference surfaces used for positioning the card holder to the intended position on the fixing ring. The number of reference surfaces provided and the positions and sizes of them may be arbitrarily determined in accordance with the need. In addition, the reference surfaces are not limited to flat ones.

The function of the cam mechanism is attained by utilization of the interaction between the two movable sections, one of which is a driven section and the other of which is a driving section. In the embodiment described above, the driving section (i.e., a cam follower) is provided for the lock ring, while the driven section (i.e., a slanted face) is provided for the card holder. Instead of this structure, the driving section may be provided for the card holder, and the driven section may be provided for the lock ring.

Although a cam follower and a slanted face were referred to in the above, they are merely examples, and the movable sections of the cam mechanism are not limited to them.

The groove of each pulley and the groove formed in the inner circumferential surface of the lock ring are only required to engage with each other. In other words, the two grooves may be replaced with a convex section and a concave section. The cross sections of these sections are not restricted to inverted-"V" shape or "V"-shape.

Air cylinders were referred to as an example of means for rotating the fixing ring in two directions. Due to the use of the air cylinders, the fixing ring is kept applied with torque acting in the rotating direction even after the fixing ring has been rotated to the stop position, thus permitting the fixing ring to reliably stop at that position. In place of the air cylinders, an electric motor or another type of driving means may be employed to rotate the fixing ring in two directions.

The guide pins provided for the fixing ring were described as being different in diameter. The reason for employing such guide pins is to prevent the probe card 3 from being fitted in the wrong direction. In the present invention, however, guide pins of the same diameter may be used. Where such guide pins are employed, they are arranged asymmetrically.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A probe card attaching mechanism for attaching a probe card to a prober that checks electric characteristics of an object to be tested, said probe card having measurement contactors which are to be brought into contact with electrodes of the object, said probe card attaching mechanism comprising:

a fixing ring secured at an opening section of the casing of a prober and having a reference surface on a lower side thereof, a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms; and means for coupling the lock ring to the lower side of the fixing ring in a rotatable manner, said coupling means including at least one grooved pulley rotatably fitted around a shaft secured to the fixing ring, and at least one groove formed in the inner circumferential portion of the lock ring, said lock ring being made rotatable under the fixing ring by engaging the groove formed in the grooved pulley with the groove of the lock ring, wherein, when the lock ring rotates in the normal direction, the movable portions of the lock ring cooperate with the movable portions of the card holder and raise the card holder until the reference surface of the card holder is pressed tightly against the reference surface of the fixing ring and the card holder is made immovable thereby, and when the lock ring rotates in the reverse direction, the movable portions of the lock ring and the movable portions of the card holder disengage from each other, and the card holder is separated from the fixing ring.

2. A probe card attaching mechanism according to claim 1, wherein the groove formed in the pulley has a "V" shape, and the groove formed in the lock ring has an inverted-"V" shape which is engageable with the groove formed in the grooved pulley.

3. A probe card attaching mechanism according to claim 1, wherein said coupling means includes a plurality of shafts secured to the fixing ring and a plurality of rotating members which are coupled to the fixing ring to be rotatable in two directions, said shafts are eccentric with reference to the rotating members, said rotating members are rotated to adjust positions of the shafts, and the grooves of the pulleys into which the shafts are fitted and the grooves formed in the lock ring are engaged or disengaged from each other.

4. A probe card attaching mechanism for attaching a probe card to a prober that checks electric characteristics of an object to be tested, said probe card having measurement contactors which are to be brought into contact with electrodes of the object, said probe card attaching mechanism comprising:

a fixing ring secured at an opening section of the casing of a prober and having a reference surface on a lower side thereof, a ring-like card holder used for holding the probe card and having a reference surface on an upper side thereof and a plurality of movable portions on an outer circumference thereof, said movable portions constituting part of a plurality of cam mechanisms; and a lock ring provided on the lower side of the fixing ring and being rotatable in both a normal direction and a reverse direction, said lock ring having movable portions which cooperate with the movable portions of the card holder and constitute part of the cam mechanisms, said lock ring including an upper ring, a lower ring and means for elastically pressing the upper and lower rings against each other, said upper ring including means for securing the lock ring to the fixing ring, said lower ring including movable portions constituting the cam mechanisms, wherein, when the lock ring rotates in the normal direction, the movable portions of the lock ring cooperate with the movable portions of the card holder and raise the card holder until the reference surface of the card holder is pressed tightly against the reference surface of the fixing ring and the card holder is made immovable thereby, and when the lock ring rotates in the reverse direction, the movable portions of the lock ring and the movable portions of the card holder disengage from each other, and the card holder is separated from the fixing ring.

5. A probe card attaching mechanism for attaching a probe card to a prober that checks electric characteristics of an object to be tested, said probe card having measurement contactors which are to be brought into contact with electrodes of the object, said probe card attaching mechanism comprising:

a fixing ring secured at an opening section of the casing of a prober and having a reference surface on a lower side thereof, said fixing ring including a plurality of guiding means which is located on the lower side thereof, a ring-like card holder used for holding the probe card and having a reference surface on an upper side thereof and a plurality of movable portions on an outer circumference thereof, said movable portions constituting part of a plurality of cam mechanisms, said plurality of guiding means of said fixing ring being configured to guide the card holder to a predetermined position, said card holder including a plurality of to-be-guided means which are guided by the guiding means; and a lock ring provided on the lower side of the fixing ring and being rotatable in both a normal direction and a reverse direction, said lock ring having movable portions which cooperate with the movable portions of the card holder and constitute part of the cam mechanisms, wherein, when the lock ring rotates in the normal direction, the movable portions of the lock ring cooperate with the movable portions of the card holder and raise the card holder until the reference surface of the card holder is pressed tightly against the reference surface of the fixing ring and the card holder is made immovable thereby, and when the lock ring rotates in the reverse direction, the movable portions of the lock ring and the movable portions of the card holder disengage from each other, and the card holder is separated from the fixing ring.

6. A probe card attaching mechanism according to claim 5, wherein each of the guiding means of the fixing ring is a guide pin projected downward from the lower side of the fixing ring, and each of the to-be-guided means of the card holder is an inversely conical hole.

7. A probe card attaching mechanism according to claim 6, wherein the guide pins of the fixing ring are different in diameter.

8. A probe card attaching mechanism for attaching a probe card to a prober that checks electric characteristics of integrated circuits formed on a semiconductor wafer, said probe card having measurement contactors which are to be brought into contact with the electrodes of the integrated circuits, said probe card attaching mechanism comprising:

a fixing ring secured at an opening section of a casing of a prober and having a reference surface on a lower side thereof;

a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms; and means for coupling the lock ring to the lower side of the fixing ring to be rotatable in both the normal and reverse directions, said coupling means comprising:
grooved pulleys into which shafts secured to the fixing ring are rotatably fitted and each of which has at least one groove; and
at least one groove formed in an inner circumferential portion of the lock ring, said lock ring being rotatably coupled to the lower side of the fixing ring by engaging the grooves of the grooved pulleys with said at least one groove of the lock ring, wherein, when said lock ring rotates in the normal direction, the movable portions of the lock ring cooperate with the movable portions of the card holder and raise the card holder until the reference surface of the card holder is pressed tightly against the reference surface of the fixing ring, and the card holder made immovable thereby, and when the lock ring rotates in the reverse direction, the movable portions of the lock ring and the movable portions of the card holder disengage from each other, and the card holder is separated from the fixing ring.

9. A probe card attaching mechanism for attaching a probe card to a prober that checks electric characteristics of integrated circuits formed on a semiconductor wafer, said probe card having measurement contactors which are to be brought into contact with the electrodes of the integrated circuits, said probe card attaching mechanism comprising:

a fixing ring secured at an opening section of a casing of a prober and having a reference surface on a lower side thereof;

a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms; and means for coupling the lock ring to the lower side of the fixing ring to be rotatable in both the normal and reverse directions, said coupling means including a plurality of shafts secured to the fixing ring and a plurality of rotating members which are coupled to the fixing ring to be rotatable in two directions, said shafts being eccentric with reference to the rotating members, said rotating members being rotated to adjust the positions of the shafts, and the grooves of the pulleys into which the shafts are fitted and the grooves formed in the lock ring being engaged or disengaged from each other, wherein, when said lock ring rotates in the normal direction, the movable portions of the lock ring cooperate with the movable portions of the card holder and raise the card holder until the reference surface of the card holder is pressed tightly against the reference surface of the fixing ring, and the card holder made immovable thereby, and when the lock ring rotates in the reverse direction, the movable portions of the lock ring and the movable portions of the card holder disengage from each other, and the card holder is separated from the fixing ring.

10. A probe card attaching mechanism for attaching a probe card to a prober that checks electric characteristics of integrated circuits formed on a semiconductor wafer, said probe card having measurement contactors which are to be brought into contact with the electrodes of the integrated circuits, said probe card attaching mechanism comprising:

a fixing ring secured at an opening section of a casing of a prober and having a reference surface on a lower side thereof;

a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms, said lock ring including an upper ring, a lower ring and means for elastically pressing the rings against each other, said upper ring including means for securing the lock ring to the fixing ring, and said lower ring including movable portions constituting the cam mechanisms; and means for coupling the lock ring to the lower side of the fixing ring to be rotatable in both the normal and reverse directions, wherein, when said lock ring rotates in the normal direction, the movable portions of the lock ring cooperate with the movable portions of the card holder and raise the card holder until the reference surface of the card holder is pressed tightly against the reference surface of the fixing ring, and the card holder made immovable thereby, and when the lock ring rotates in the reverse direction, the movable portions of the lock ring and the movable portions of the card holder disengage from each other, and the card holder is separated from the fixing ring.

11. A probe card attaching mechanism for attaching a probe card to a prober that checks electric characteristics of integrated circuits formed on a semiconductor wafer, said probe card having measurement contactors which are to be brought into contact with the electrodes of the integrated circuits, said probe card attaching mechanism comprising:

a fixing ring secured at an opening section of a casing of a prober and having a reference surface on a lower side thereof, said fixing ring including a plurality of guide pins, located on the lower side thereof, for guiding a card holder to a predetermined position, said card holder having a plurality of inversely conical holes, each of said guide pins serving as guiding means, each of said inversely-conical holes serving as to-be-guided means;

a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms; and means for coupling the lock ring to the lower side of the fixing ring to be rotatable in both the normal and reverse directions, wherein, when said lock ring rotates in the normal direction, the movable portions of the lock ring cooperate with the movable portions of the card holder and raise the card holder until the reference surface of the card holder is pressed tightly against the reference surface of the fixing ring, and the card holder made immovable thereby, and when the lock ring rotates in the reverse direction, the movable portions of the lock ring and the movable portions of the card holder disengage from each other, and the card holder is separated from the fixing ring.

12. A probe card attaching mechanism according to claim 11, wherein said guide pins of the fixing ring are different in diameter.

13. A probe card attaching mechanism for attaching a probe card to a prober that checks electric characteristics of an object to be tested, said probe card having measurement contactors which are to be brought into contact with electrodes of the object, said probe card attaching mechanism comprising:

a fixing ring secured at an opening section of the casing of a prober and having a reference surface on a lower side thereof;

a ring-like card holder used for holding the probe card and having a reference surface on an upper side thereof and a plurality of movable portions on an outer circumference thereof, said movable portions constituting part of a plurality of cam mechanisms; and a lock ring provided on the lower side of the fixing ring and being rotatable in both a normal direction and a reverse direction, said lock ring having movable portions which cooperate with the movable portions of the card holder and constitute part of the cam mechanisms, wherein, when the lock ring rotates in the normal direction, the movable portions of the lock ring cooperate with the movable portions of the card holder and raise the card holder until the reference surface of the card holder is pressed tightly against the reference surface of the fixing ring and the card holder is made immovable thereby, and when the lock ring rotates in the reverse direction, the movable portions of the lock ring and the movable portions of the card holder disengage from each other, and the card holder is separated from the fixing ring, and wherein said lock ring releases the card holder from the held state at a disengagement position where the movable portions of the cam holder and the movable portions of the lock ring are in disengagement, said fixing ring includes force applying means for applying the card holder with an elastic force that permits the card holder to separate from the lock ring, and said card holder is forcibly separated from the lock ring by the force applying means at the disengagement position.

14. A probe card attaching mechanism according to claim 13, wherein said force applying means of the fixing ring includes a spring.

15. A probe card attaching mechanism for attaching a probe card to a prober that checks electric characteristics of integrated circuits formed on a semiconductor wafer, said probe card having measurement contactors which are to be brought into contact with the electrodes of the integrated circuits, said probe card attaching mechanism comprising:

a fixing ring secured at an opening section of a casing of a prober and having a reference surface on a lower side thereof;

a ring-like card holder used for holding the probe card and having a reference surface on an upper side thereof and a plurality of movable portions on an outer circumference thereof, said movable portions constituting part of a plurality of cam mechanisms;

a lock ring provided on the lower side of the fixing ring and being rotatable in both a normal direction and a reverse direction, said lock ring having movable portions which cooperate with the movable portions of the card holder and constitute part of the cam mechanisms; and means for coupling the lock ring to the lower side of the fixing ring to be rotatable in both the normal and reverse directions, wherein, when said lock ring rotates in the normal direction, the movable portions of the lock ring cooperate with the movable portions of the card holder and raise the card holder until the reference surface of the card holder is pressed tightly against the reference surface of the fixing ring, and the card holder made immovable thereby, when the lock ring rotates in the reverse direction, the movable portions of the lock ring and the movable portions of the card holder disengage from each other, and the card holder is separated from the fixing ring, and wherein said lock ring releases the card holder from a held state at a disengagement position where the movable portions of the cam holder and the movable portions of the lock ring are in disengagement, said fixing ring is provided with force applying means for applying the card holder with an elastic force that permits the card holder to separate from the lock ring, said card holder is forcibly separated from the lock ring by the force applying means at the disengagement position.

* * * * *